United States Patent
Hawryluk et al.

(10) Patent No.: US 6,495,390 B2
(45) Date of Patent: Dec. 17, 2002

(54) THERMALLY INDUCED REFLECTIVITY SWITCH FOR LASER THERMAL PROCESSING

(75) Inventors: Andrew M. Hawryluk, Los Altos Hills, CA (US); Somit Talwar, Palo Alto, CA (US); Yun Wang, San Jose, CA (US); Michael O. Thompson, Ithaca, NY (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/940,102

(22) Filed: Aug. 27, 2001

(65) Prior Publication Data

US 2002/0022294 A1 Feb. 21, 2002

Related U.S. Application Data

(62) Division of application No. 09/592,184, filed on Jun. 12, 2000, now Pat. No. 6,303,476.

(51) Int. Cl.[7] .................................................. H01L 21/00
(52) U.S. Cl. ............................. 438/56; 438/24; 438/54
(58) Field of Search ............................... 257/414, 431, 257/436; 438/541, 241, 56

(56) References Cited

U.S. PATENT DOCUMENTS 5,908,307 A 6/1999 Talwar et al. ................ 438/199

*Primary Examiner*—Long Pham
(74) *Attorney, Agent, or Firm*—Allston L. Jones

(57) ABSTRACT

A method, apparatus and system for controlling the amount of heat transferred to a process region (30) of a workpiece (W) from exposure with laser radiation (10) using a thermally induced reflectivity switch layer (60). The apparatus of the invention is a film stack (6) having an absorber layer (50) deposited atop the workpiece, such as a silicon wafer. A portion of the absorber layer covers the process region. The absorber layer absorbs laser radiation and converts the absorbed radiation into heat. A reflective switch layer (60) is deposited atop the absorber layer. The reflective switch layer may comprise one or more thin film layers, and preferably includes a thermal insulator layer and a transition layer. The portion of the reflective switch layer covering the process region has a temperature that corresponds to the temperature of the process region. The reflectivity of the reflectivity switch layer changes from a low reflectivity state to a high reflectivity state at a critical temperature so as to limit the amount of radiation absorbed by the absorber layer by reflecting the incident radiation. This, in turn, limits the amount of heat transferred to the process region from the absorber layer.

40 Claims, 3 Drawing Sheets

THERMALLY INDUCED REFLECTIVITY SWITCH FOR LASER THERMAL PROCESSING

This is a continuation divisional of application(s), Ser. No. 09/592,184, filed on Jun. 12, 2000, now U.S. Pat. No. 6,303,476.

FIELD OF THE INVENTION

The present invention relates to laser thermal processing, and in particular to a method of and apparatus for delivering precise amounts of thermal energy to a workpiece to be so processed.

BACKGROUND OF THE INVENTION

Laser thermal processing (LTP) is used to process workpieces such as semiconductor wafers in the manufacturing of semiconductor devices. Such processing allows for the fabrication of transistors with very low sheet resistance and ultra-shallow junctions, which results in a semiconductor device (e.g., an integrated circuit or "IC") having higher performance (e.g., faster speed).

One method of LTP applied to semiconductor manufacturing involves using a short-pulsed laser to thermally anneal the source and drain of the transistor and to activate the implanted dopants therein. Under the appropriate conditions, it is possible to produce source and drain junctions with activated dopant levels that are above the solid solubility limit This produces transistors with greater speeds and higher drive currents. This technique is disclosed in U.S. Pat. No. 5,908,307 entitled "Fabrication Method for Reduced Dimension FET Devices," incorporated by reference herein.

It is expected that ICs will benefit from the performance improvement demonstrated with performing LTP on single transistors. Unfortunately, scaling LTP from single transistor fabrication to full integrated circuit fabrication is difficult. The LTP process has a very narrow process window (i.e., the range in laser energy that activates the transistor without causing damage is narrow) and requires considerable uniformity, stability and reproducibility in the absolute energy delivered to (and absorbed by) each transistor.

Modem ICs contain a variety of device geometries and materials, and thus different thermal masses. To achieve uniform performance in each transistor, it is necessary that all transistors be heated (annealed) to essentially the same temperature. This places constraints on the permissible range of laser energy delivered to each transistor in the circuit. As a result, two problems arise. The first is that it is difficult to achieve sufficiently uniform exposures (both spatially and temporally) to accomplish uniform heating. The second is that different device geometries require different amounts of incident laser energy because their different thermal masses will affect the local temperature in the doped regions (junctions).

Of these two problems, the more daunting is the effect of local transistor density. Most modem integrated circuits have a variety of transistor densities across the circuit. This variation has two effects on the LTP process. The first is that the local reflectivity varies spatially, thereby changing the amount of heat locally absorbed even with uniform illumination. The second is that the local thermal mass varies spatially. A larger thermal mass requires greater absorbed laser energy to reach the required annealing temperature. As a result, a change in the local thermal mass requires a change in the amount of laser energy absorbed that is required to produce proper annealing. Even with perfectly uniform illumination, there can be significant temperature variations between different transistors on a single IC, or between ICs. This leads to undesirable variations in transistor performance across a single IC and across a product line.

In principle, it may be possible to compensate for the location of higher transistor density across the device by providing a tailored exposure having increased laser fluence in the higher density regions. However, this would require knowing the precise circuit layout across the device for each device to be processed, and would also require precise tailoring of the spatial irradiance distribution of the exposure to match the circuit layer. This endeavor, if it could be accomplished at all, would involve complex apparatus and significant expense.

SUMMARY OF THE INVENTION

The present invention relates to laser thermal processing, and in particular to a method of and apparatus for delivering precise amounts of thermal energy to a workpiece to be so processed.

The present invention solves the problem of non-uniform thermal heating of a workpiece processed using laser radiation by introducing a thermally-induced reflectivity "switch" that controls the amount of heat transferred to a workpiece, such as a silicon wafer. This reflectivity switch layer comprises one or more layers of material designed such that the reflectivity of the switch to incident laser radiation changes from "low" to "high" as one or more underlying process regions of the workpiece reach a predetermined temperature. This temperature may be, for example, the temperature at which the process region is activated. For example, the one or more underlying regions may be the source and drain regions of a transistor or a doped region of a junction, and the predetermined temperature may be the activation temperature of the process region. The portions of the reflective switch layer overlying the process regions switches from a low reflectivity state to a high reflectivity state and reflects additional incident laser radiation when a critical switch temperature is achieved, thereby preventing further heating of the underlying process regions and limiting the temperature of the one or more underlying regions to a maximum value.

When the present invention is applied to semiconductor manufacturing and forming IC devices having transistors, the predetermined temperature is that where amorphous silicon in the source-drain regions of the transistors reach a temperature between 1100 and 1410° C. At this point, the amorphous silicon is melted and the dopants become activated. This temperature is low enough so that the underlying crystalline silicon substrate does not melt, which is desirable from the viewpoint of device performance. The reflectivity switch of the present invention prevents local regions on the wafer from heating substantially beyond the predetermined temperature due to a variety effects, such as fluctuations in the laser energy, the spatial uniformity of the laser beam, or the thermal mass variations due to the transistor density.

DETAILED DESCRIPTION OF THE INVENTION

The present invention relates to laser thermal processing, and in particular to a method of and apparatus for delivering precise amounts of thermal energy to a workpiece to be so processed.

Figure 1:
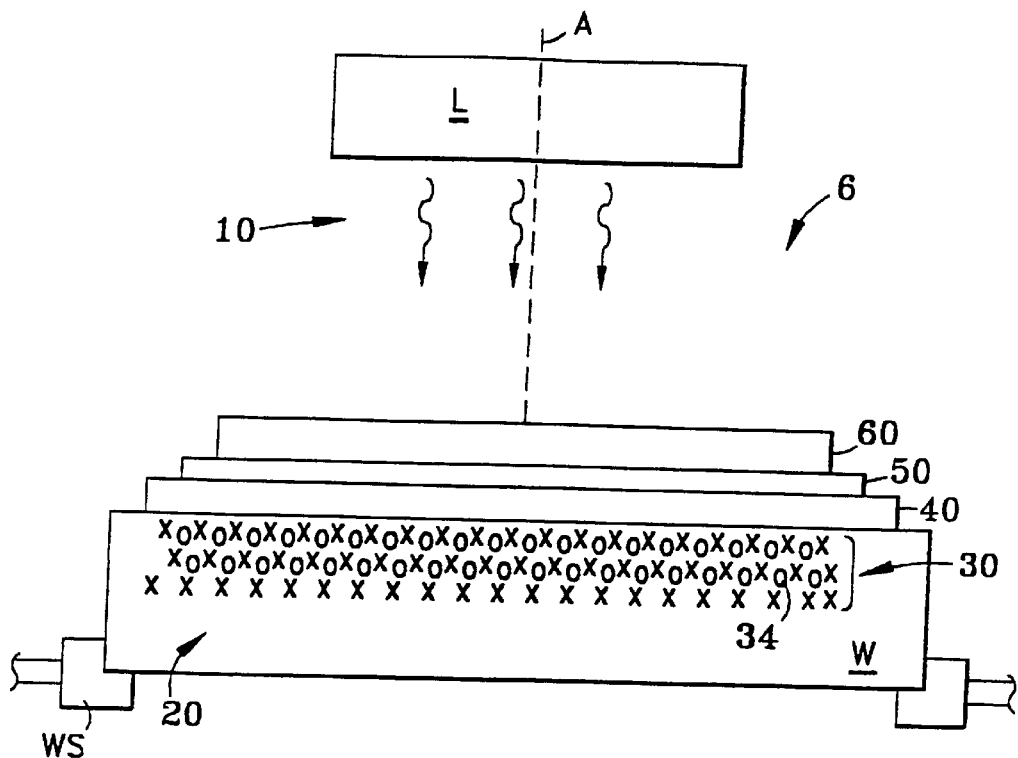
FIG. 1 is a schematic cross-sectional diagram of the reflective switch of the present invention shown as part of a film stack arranged on a semiconductor wafer having an amorphous doped region, with the wafer arranged in a wafer holder in relation to a laser light source.
Figure 2:
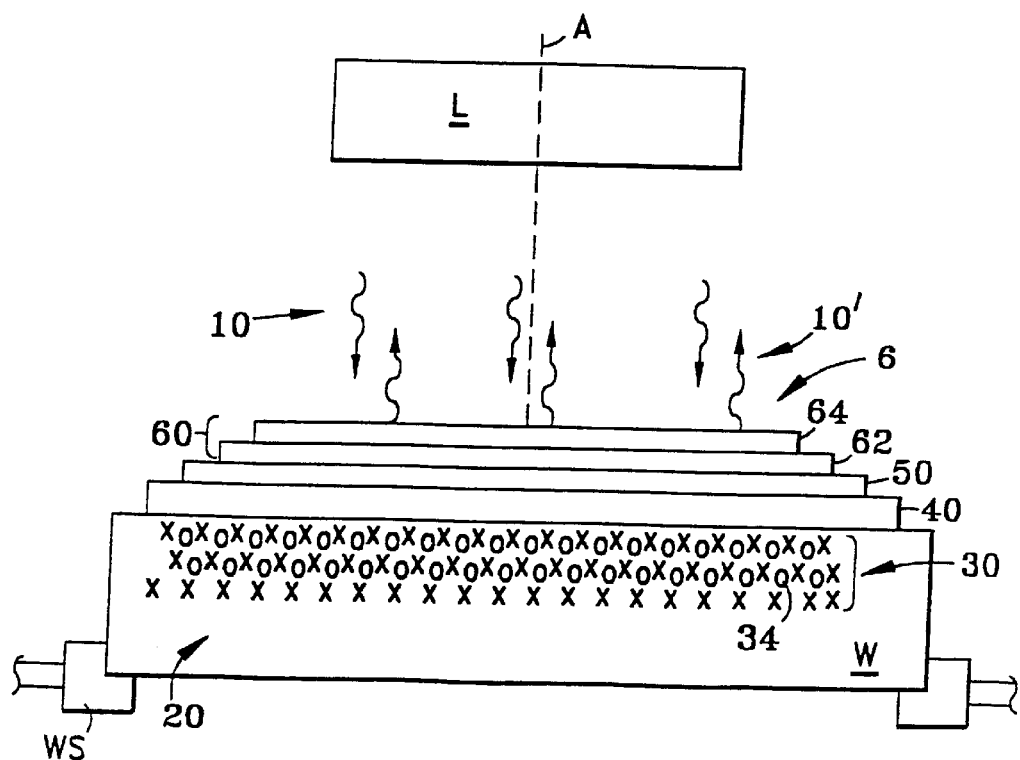
FIG. 2 is the same as FIG. 1, but the reflective switch layer of the film stack comprises a layer of silicon dioxide adjacent the absorber layer, and amorphous or polycrystalline silicon adjacent the silicon dioxide layer.

The basic concept of the reflectivity switch is illustrated in FIGS. 1 and 2 with regard to processing a semiconductor substrate as part of the process of manufacturing a semiconductor device such as a junction or a transistor. In FIG. 1, there is shown a film stack 6 formed on a silicon semiconductor wafer W as a workpiece to be processed using LTP and laser irradiation 10 from a laser light source L. Wafer W is supported by a wafer support member WS such that light source L, film stack 6 and wafer W all lie along an axis A, as shown in FIG. 1. Laser radiation 10 is preferably pulses of light having a wavelength of between 500 nm and 1100 nm. A suitable laser light source L includes a YAG laser operating at 1064 nm, a frequency-doubled YAG laser operating at 532 nm, and an Alexandrite laser operating between 700 and 800 nm. Suitable laser pulse lengths range from 1 nanosecond to 1 μsecond, and suitable energy levels range from 0.1–10 J/cm².

Wafer W comprises a crystalline silicon region 20 within which is formed an amorphous doped silicon region 30 having dopants 34. For the sake of explanation, amorphous doped region 30 is considered as a single doped region. However, amorphous doped region 30 represents one example of a region to be processed, referred to herein as a "process region." For example, wafer W may contain a plurality of amorphous doped regions 30, or one positively doped region and one negatively doped region serving as source and drain regions, respectively, of a transistor.

With continuing reference to FIG. 1, amorphous doped region 30 may be formed by performing an ion implant of Si or Ge ions into wafer W to a target depth ranging from a few angstroms to about 1000 angstroms. This implantation process disorders the substrate crystal structure in crystal region 20 to the point of making this implanted region amorphous. The implanted species can be Si, Ge, Ar, As, P, Xe, Sb, and In. Implantation of amorphizing dopants can be performed with known apparatus, such as the 9500 XR ION IMPLANTER™, commercially available from Applied Materials, Inc., San Jose, Calif.

A second dopant ion implant is then performed using p-type dopant ions (e.g., boron, aluminum, gallium, beryllium, magnesium, or zinc) or n-type dopant ions (e.g., phosphorous, arsenic, antimony, bismuth, selenium, and tellurium) from an ion implanter. The ions are accelerated to a given energy level (e.g., 200 eV to 40 KeV) and implanted in the previously amorphized region to a given dose (e.g., about $1\times10^{14}$ atoms/cm² to $1\times10^{16}$ atoms/cm²), thereby forming doped, amorphous region 30. The latter typically has, in practice, a concentration of dopant that is graded with depth into wafer W. The first and second steps of the present embodiment can be interchanged to achieve the same effect, or carried out in a single step if the dopant implant also amorphizes crystalline region 20.

Deposited atop amorphous silicon region 30 is an absorber layer 50 comprising a material capable of absorbing incident laser radiation and converting the absorbed radiation into heat. Absorber layer 50 heeds to be capable of withstanding high temperatures, i.e., temperatures in excess of the crystalline silicon melting temperature of 1410° C. The material making up absorber layer 50 must also be easily removable without impacting the layers or regions below. One role of absorber layer 50 is to maintain the physical structure of devices resident in or on wafer W during processing. An exemplary material for absorber layer 50 is tantalum nitride (TaN), deposited to a thickness of between 500 and 1000 angstroms via sputtering or by CVD. Other preferred materials for absorber layer 50 include titanium (Ti), titanium nitride (TiN), tantalum (Ta), tungsten nitride (WN), silicon dioxide, silicon nitride, or a combination of these. A silicon dioxide or silicon nitride layer may need to be deposited as part of the absorber layer to prevent contamination of wafer W by the absorber layer material (i.e., between metal and semiconductor), or adjust the reflectivity of the absorber layer.

A thin strippable layer 40 is optionally placed between absorber layer 50 and amorphous silicon region 30 to facilitate stripping of the absorber layer after LTP is performed. Exemplary materials for stripping layer 40 include silicon dioxide and silicon nitride, which can be deposited by sputtering or by CVD.

Further included in film stack 6 is a reflectivity switch layer 60 formed atop absorber layer 50. Layer 60 is designed so that it is initially substantially transparent to laser radiation 10, allowing absorber layer 50 to perform as described above. However, the properties of layer 60 are such that its reflectivity to incident laser radiation 10 changes from low to high when it reaches a certain temperature, referred to herein as the threshold temperature.

Reflectivity switch layer 60 can comprise a single film layer or multiple film layers (i.e., one or more film layers). With reference to FIG. 2, in one embodiment, reflective switch layer 60 comprises a first thermal insulating layer 62 of silicon dioxide and a second transition layer 64 of amorphous or polycrystalline silicon atop the silicon dioxide layer. It is desirable to design the thicknesses of reflectivity switch layer 60 so as to optimize the coupling of the laser radiation 10 into absorber layer 50. This can be done by using standard thin film design techniques to optimize the thicknesses and index of refraction of the materials in film stack 6 such that there is a minimum reflectivity at room temperature for incident radiation 10. In a preferred embodiment of the present invention, layer 62 has a thickness ranging from about 10–250 nm, while the thickness of layer 64 ranges from about 10–250 nm. This provides a reflectivity in the low reflectivity state in the range from about 5% to 20%, and a reflectivity in the high reflectivity state in the range from about 50% to 75% for a wavelength of light of about 1000 nm.

Method of Operation

The present invention operates as follows. With reference to FIGS. 1 and 2, LTP of wafer W is performed by directing laser radiation 10 to film stack 6 along an axis A for the purpose of activating amorphous doped region 30. Reflectivity switch layer 60 is initially substantially transparent. Accordingly, most of laser radiation 10 passes through layer 60 and is incident absorber layer 50. Radiation 10 is absorbed in layer 50, thereby heating this layer. Absorber layer 50 heats up and re-radiates this heat to amorphous doped region 30 and to reflectivity switch layer 60. Doped amorphous region 30 is thus heated to its activation temperature of between 1100–1410° C., while reflective switch layer 60 is also heated to its critical temperature. In the activation temperature range, dopants 34 become incorporated into the lattice sites and are "activated." However, if too much laser radiation is incident absorber layer 50 then amorphous region 30 is provided with too much heat. In this regard, the present invention prevents the workpiece (wafer W) from reaching or exceeding a maximum workpiece temperature, which is an upper temperature beyond which there is an undesirable affect on the workpiece (e.g., melting). This extra heat can cause the underlying crystalline silicon region 20 to melt. This is undesirable because it can adversely affect the properties of amorphous doped region 30. Where the latter constitutes the source or drain region of a transistor, such overheating can damage the transistor gate region (not shown).

Figure 3:
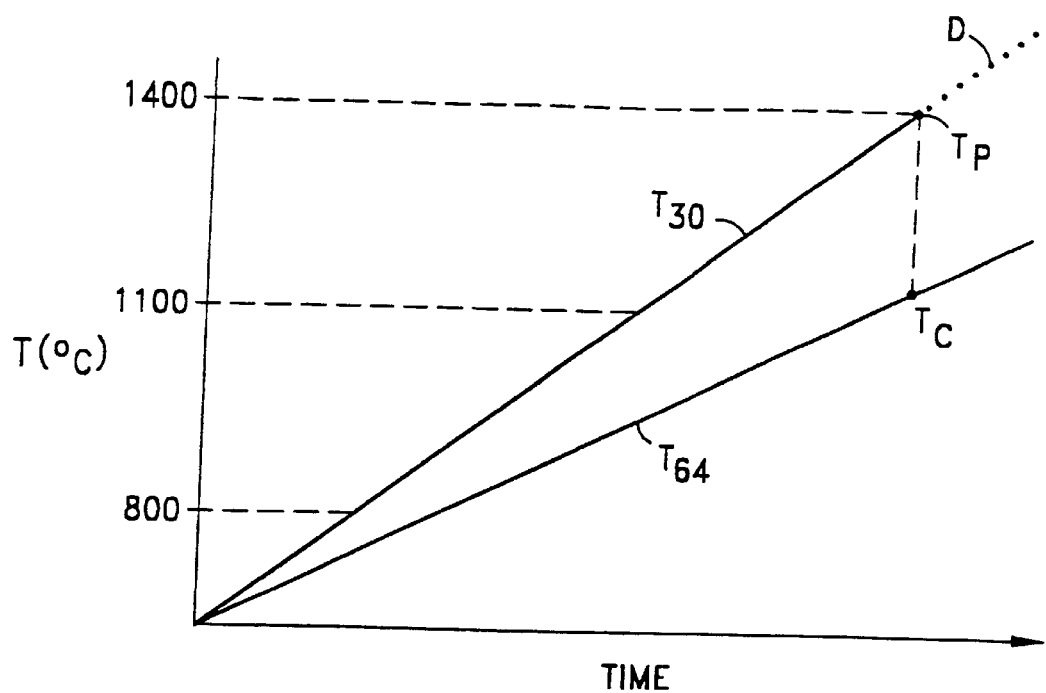
FIG. 3 is a plot of the temperature T vs. time for the temperature ($T_{64}$) of the reflective switch layer and the temperature ($T_{30}$) of the amorphous doped region versus time, showing the point, $T_c$, where the reflectivity of the switch layer transitions from a low reflectivity state (i.e., transparent state) to a high reflectivity state.

FIG. 3 illustrates the temperature $T_{30}$ of amorphous doped region 30 during the LTP annealing process as described above. Temperature $T_{30}$ rises as a function of time during LTP exposure. Unconstrained, temperature $T_{30}$ rises above the melting point $T_p$=1410° C. for crystalline silicon, as illustrated with a dotted line D. However, with reflectivity switch layer 60 present (see FIG. 1), the temperature $T_{64}$ of reflectivity switch layer 64 tracks temperature $T_{30}$ of region 30. Accordingly, reflectivity switch layer 64 can be designed to have a temperature that is greater than or less than temperature $T_{30}$ by adjusting the thickness and thermal characteristics of layer 62. For example, where reflectivity switch layer comprises two layers 62 and 64 as discussed above, this may involve adjusting the thickness of layer 62 in the manner described in detail below. In FIG. 3, the critical temperature $T_c$ is set such that this temperature is reached when the temperature $T_{30}$ of process region 30 reaches temperature $T_p$. However, it will often be preferable to set temperature $T_c$ so that it is reached prior to when the temperature $T_{30}$ reaches $T_p$.

Figure 4:
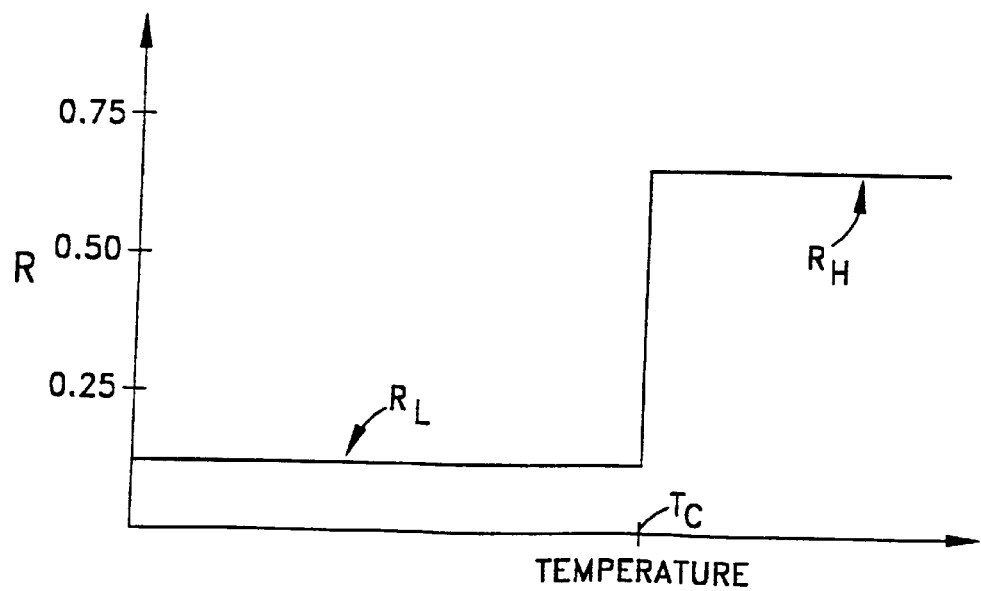
FIG. 4 is a plot of reflectivity R versus time for the reflective switch layer, showing the transition from a low reflectivity state (i.e., nearly transparent state) to a high reflectivity state.

When reflectivity switch layer 64 reaches its critical temperature $T_c$, the reflectivity switches from a low reflectivity state $R_L$ to a high reflectivity state $R_H$, as illustrated in FIG. 4. The switch occurs primarily because of the change in reflectivity of layer 64 when it reaches this critical temperature (such as when the material changes from a solid to liquid state). The timing, or tracking, of the temperature of layer 64 relative to $T_{30}$ is accomplished by adjusting the thermal conductivity and thickness of layer 62. Properly designed, reflectivity switch layer 60 can have a low reflectivity (less than 10%) and a high reflectivity (>70%).

Reflectivity switch layer 60 is designed as follows: The process begins by choosing the operational laser wavelength and pulse-length. For this example, consider a wavelength of 1064 nm and a pulse-length of 10 nanoseconds. Next is chosen optional strippable layer 40 and absorber layer 50. Typically, strippable layer 40 can be 10–20 nm of silicon dioxide or silicon nitride, and absorber layer 50 can be 20–100 nm of titanium, titanium-nitride, titanium, or a combination of these layers. The purpose of absorber layer 50 is to absorb incident laser radiation 10, so sufficient material must be used to absorb greater than about 75% of the incident radiation. For this example, a 10 nm oxide for layer 40 and 40 nm titanium for layer 50 is a suitable choice. Next, an arbitrary thickness for layer 62 is chosen. Appropriate materials are either silicon dioxide or silicon nitride. For this example, 50 nm of silicon dioxide is a suitable choice. Finally, an arbitrary thickness for layer 64 is chosen. Appropriate materials for layer 64 are any materials that exhibit a significant change in reflectivity when heated to a temperature range between about 1000–3000° C., such as crystalline silicon, polycrystalline silicon, amorphous silicon, or titanium. Layer 64 is chosen such that its optical properties change significantly when it melts. A layer 64 comprising 100 nm of amorphous silicon is a suitable choice for the present example.

The next step in designing reflectivity switch layer 60 is to minimize the optical reflectivity of film stack 6 using a thin-film analysis code. Several such codes are commercially available, such as CODE V from Optical Research Associates, Calif. The reflectivity of film stack 6 is minimized from the stack by adjusting layer 64, the 100 nm of amorphous silicon. The goal is to produce a film stack 6 with a reflectivity less than 10%. Once this is accomplished, a thermal transport code is used, such as TOPAZ from Lawrence Livermore National Laboratory, Livermore, Calif., to calculate the thermal properties of film stack 6 and the underlying layer 30. In particular, the temperature of layer 64 relative to region (layer) 30 is calculated and plotted. The thickness of layer 62 is then varied until layer 64 reaches its melt temperature at the same time when region 30 reaches its activation temperature. This insures that layer 62 will begin to reflect any additional laser radiation away from the structure after region 30 has been activated. Finally, the reflectivity of the stack is re-optimized (by optimizing layer 64) with the new thickness value for layer 62. In the above example, the optimum stack is calculated to be:

Layer 40: silicon dioxide: 10 nm
Layer 50 titanium: 40 nm
Layer 62: silicon dioxide: 80 nm
Layer 64: amorphous silicon: 163 nm With this stack of materials, film stack 6 has a minimum reflectivity of 6% (at room temperature), and a maximum reflectivity of 70% (at region 30 activation temperature) is predicted.

Other examples of film stack 6 are as follows:
At a wavelength of 1064 nm and a pulse-length of 10 nsec:
Layer 40: silicon dioxide: 10 nm
Layer 50 titanium: 20 nm followed with titanium nitride: 20 nm
Layer 62: silicon dioxide: 80 nm
Layer 64: amorphous silicon: 163 nm
At a wavelength of 1064 nm and a pulse-length of 30 nsec:
Layer 40: silicon dioxide: 10 nm
Layer 50 titanium: 20 nm followed with titanium nitride: 20 nm
Layer 62: silicon nitride: 266 nm
Layer 64: amorphous silicon: 50 nm Accordingly, reflectivity switch layer 60 is designed so it reaches its critical temperature at which the reflectivity change occurs before amorphous doped region 30 reaches a temperature of about 1410° C., but after it reaches the dopant activation temperature of 1100° C. This is achieved by properly designing thermal insulating layer 62, as described above. By choosing its thickness and thermal properties in the manner described above the temperature of transition layer 64 can be engineered so that its reflectivity switches at the proper temperature. Once reflectivity switch layer 64 transitions from a low reflectivity state $R_L$ to a high reflectivity state $R_H$, incident laser radiation 10 is reflected, as indicated by reflected radiation 10' in FIG. 2. This prevents further heating of absorber layer 50 and therefore, further heating of amorphous doped region 30.

By way of example, consider the two-layer reflectivity switch layer 60 discussed above in connection with FIG. 2. When layer 64 reaches its melt temperature of 1100° C., it will begin to reflect a significant amount of incident laser radiation 10, as indicated by reflected radiation 10'. The role of layer 62 is to provide the necessary relationship between the temperature of amorphous layer 30, and layer 64. Accordingly, by tailoring the thickness of layer 62 in the manner described above, the temperature at which layer 64 "switches" relative to when amorphous doped region 30 is activated can be controlled. Even though reflectivity switch layer 60 may begin to reflect radiation when it reaches the switching temperature (e.g., 1100° C. for an amorphous silicon), amorphous doped region 30 may be at a significantly different temperature. Generally speaking, reflectivity switch layer 60 is designed to change reflectivity state so as to allow activation of the process region without melting the surrounding region (e.g., crystalline region 20).

Note also that for a reflectivity switch layer 60 comprising multiple layers, only one of the layers may be the layer that changes reflectivity (i.e., the "transition layer"), while the other layers are "temperature-adjusting layers" that are used to set the critical temperature of the transition layer. For the two-layer example of reflectivity switch layer 60 comprising layers 62 and 64, layer 64 is the transition layer, while layer 62 is the temperature-adjusting layer.

Other possible compositions for reflectivity switch layer 60 include a two-layer geometry with layer 62 comprising silicon dioxide, silicon nitride, silicon oxynitride, or any combination thereof, and layer 64 comprising silicon, titanium or any other material that changes reflectivity state in the temperature range from 1000–3000° C. These films may be deposited by physical or chemical vapor deposition.

Figure 5:
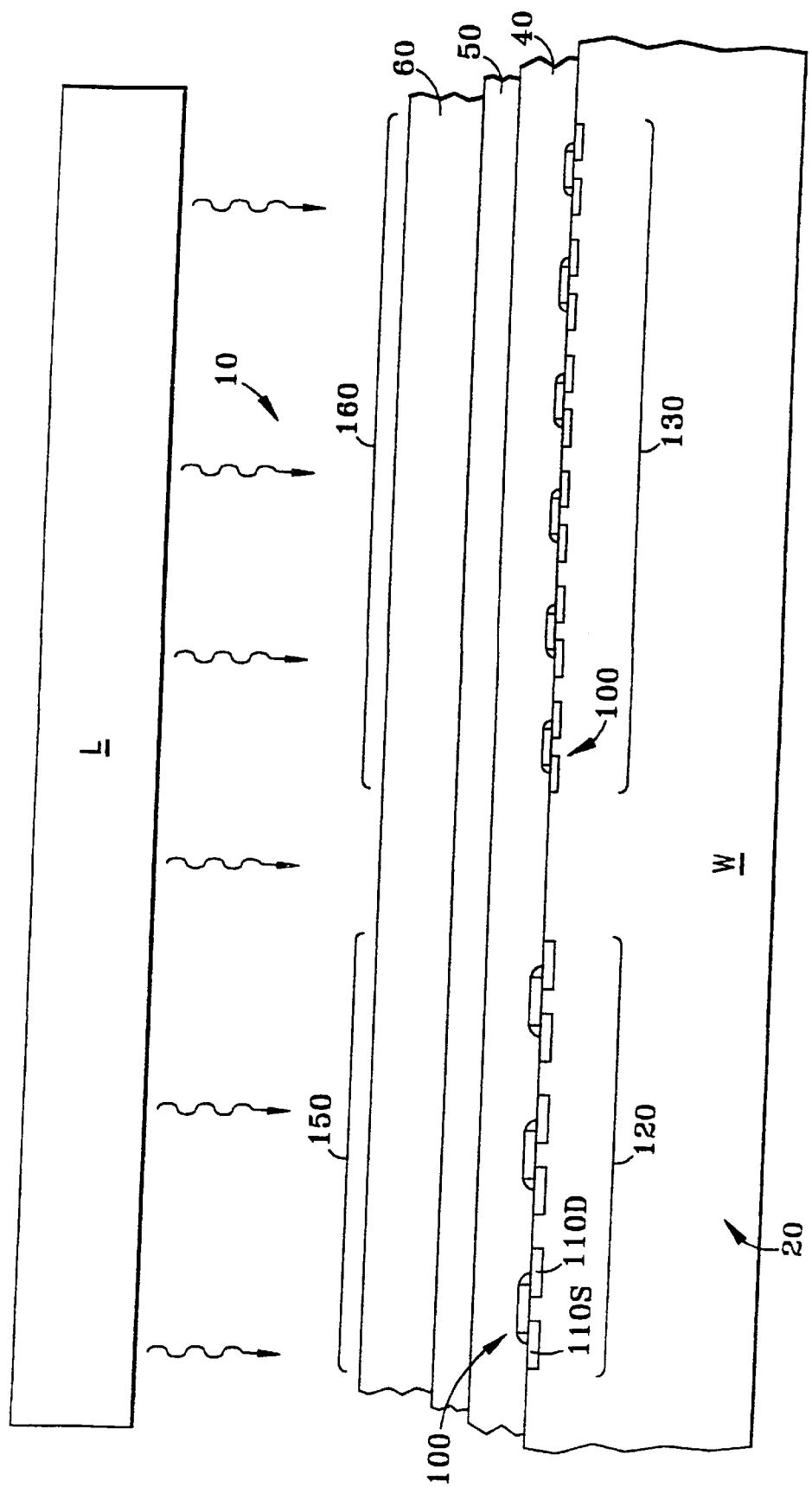
FIG. 5 is a cross-sectional schematic diagram of a wafer having devices (e.g., transistors) in a region of high device density and a region of low device density, with the film stack of FIG. 1 arranged thereon.

With reference now to FIG. 5, non-uniformities in laser radiation 10 or variations in the density of devices 100 across wafer W influence the temperature of amorphous doped regions 30, which in FIG. 5 are sources and drains 110S and 110D in devices 100. This will influence the temperature of reflectivity switch layer 60. As a result, reflectivity switch layer 60 will only activate when source and drain regions 110S and 110D reach the dopant activation temperature range of 1100–1410° C. The density of devices 100 in region 120 is less than that of region 130, so that region 120 has a smaller thermal mass as compared to region 130. Accordingly, devices 100 in region 120 will be heated more quickly than the devices in region 130.

As a result, when irradiated with laser radiation 10, devices 100 in region 120 will reach their activation temperature before the devices in region 130. Thus, portion 150 of reflectivity switch layer 60 lying above region 120 will transition to the reflective state first, and will reflect incident radiation 10. Meanwhile, devices 100 in region 130 take longer to reach the activation temperature and continue to absorb heat from absorber layer 50. Accordingly, portion 160 of reflectivity switch layer 60 lying above region 130 remains transparent for a longer time and then transitions to the high reflective state when devices 100 in region 130 reach their activation temperature. The same phenomenon occurs where regions 120 and 130 have different reflectivities.

Because of the adaptive properties of reflectivity switch layer 60, it is difficult to overexpose regions (e.g., regions 120 and 130) on wafer W having different thermal masses, or different reflectivities. Accordingly, locations where the local device geometry is such that greater or lesser amounts of laser radiation are required are readily and automatically compensated.

Method of Forming a Semiconductor Device

Based on the above, the present invention includes a method of forming a semiconductor device from a semiconductor wafer. With reference again to FIG. 5, the method includes the steps of forming one or more process region in semiconductor wafer W comprising devices 100 having amorphous doped silicon regions, such as source and drain regions 110S and 110D, respectively, each having an activation temperature. The next steps involve depositing an absorber layer over the process region, depositing a reflective switch layer atop the absorber layer, and irradiating the absorber layer through the reflective switch layer to heat the absorber layer and the reflective switch layer. These steps are described above, as is the step of heating the process region with heat from the absorber layer until the reflective switch layer reaches the activation temperature. At this point, the reflective switch layer switches to a high reflectivity state, thereby reducing the amount of radiation incident the absorber layer. The final step is then removing the absorber layer and the reflective switch layer. This can be achieved by using commercial etch techniques.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A thermally induced reflectivity switch apparatus for controlling the amount of heat transferred to a process region of a workpiece from exposure with laser radiation, comprising:

a) an absorber layer deposited atop the workpiece, a portion of which covers the process region, wherein the absorber layer absorbs laser radiation and converts the absorbed radiation into heat; and b) a reflective switch layer deposited atop the absorber layer, wherein a portion of said reflective switch layer covering said process region has a temperature that corresponds to the temperature of the process region and changes reflectivity from a low reflectivity state to a high reflectivity state at a critical temperature so as to limit the amount of radiation absorbed by the absorber layer and thus the amount of heat transferred to the process region.

2. The apparatus of claim 1, wherein said process region has an activation temperature and the workpiece has a maximum temperature, and wherein said critical temperature is such that the process region temperature reaches said activation temperature but does not exceed said workpiece maximum temperature.

3. The apparatus of claim 1, further including a strippable layer arranged between said absorber layer and said workpiece.

4. The apparatus of claim 1, wherein the process region comprises a source and drain region of a transistor.

5. The apparatus of claim 1, wherein the process region comprises doped amorphous silicon.

6. The apparatus of claim 2, wherein the process region comprises doped amorphous silicon.

7. The apparatus of claim 6, wherein said activation temperature is between 1100 and 1410° C.

8. The apparatus of claim 1, wherein said absorber layer comprises at least one of titanium, tungsten, tantalum, silicon oxide, silicon nitride, or titanium-nitride.

9. An apparatus according to claim 1, wherein said reflectivity switch layer comprises a first layer of silicon dioxide adjacent said absorber layer and a second layer of amorphous silicon or polycrystalline silicon adjacent said silicon dioxide layer.

10. An apparatus according to claim 9, wherein said first layer of silicon dioxide has a thickness between 10–250 nm, and said second layer is amorphous silicon having a thickness between 10–250 nm.

11. An apparatus according to claim 9, wherein said first layer of silicon dioxide has a thickness between 10–250 nm, and said second layer is polycrystalline silicon having a thickness between 10–250 nm.

12. A system for controlling the amount of heat transferred to a process region of a workpiece, comprising:
   a) a laser source;
   b) a workpiece support member arranged adjacent the laser source for supporting the workpiece; and
   c) a thermally induced reflectivity switch apparatus arranged on the workpiece comprising:
      i) an absorber layer deposited atop the workpiece, a portion of which covers the process region, wherein the absorber layer absorbs laser radiation and converts the absorbed radiation into heat; and
      ii) a reflective switch layer deposited atop the absorber layer, wherein a portion of said reflective switch layer covering said process region has a temperature that corresponds to the temperature of the process region and changes reflectivity from a low reflectivity state to a high reflectivity state at a critical temperature so as to limit the amount of radiation absorbed by the absorber layer and thus the amount of heat transferred to the process region.

13. A system according to claim 12, wherein said laser source emits laser radiation at a wavelength between 500 nm and 1100 nm.

14. A reflectivity switch apparatus, comprising:
   an absorber layer formed atop a workpiece and covering one or more process regions;
   a reflectivity switch comprising one or more layers formed atop the absorber layer, wherein said reflectivity switch changes reflectivity from a low reflectivity state to a high reflectivity state upon reaching a critical temperature.

15. The apparatus of claim 14, wherein the critical temperature corresponds to an activation temperature of the one or more process regions.

16. The apparatus of claim 14, wherein the critical temperature is less than a melting temperature of the workpiece.

17. The apparatus of claim 16, wherein the workpiece comprises crystalline polysilicon and the critical temperature is less than 1410° C.

18. The apparatus of claim 17, wherein the one or more process regions include amorphous doped silicon.

19. The apparatus of claim 14, wherein the absorber layer comprises one or more materials selected from the group of materials consisting of: titanium, titanium nitride, tantalum, tantalum nitride, tungsten nitride, silicon dioxide, and silicon nitride.

20. The apparatus of claim 14, wherein the reflectivity switch comprises a thermal insulating layer and a transition layer.

21. The apparatus of claim 20, wherein the thermal insulating layer comprises silicon dioxide.

22. The apparatus of claim 21, wherein the transition layer comprises amorphous or polycrystalline silicon atop the silicon dioxide layer.

23. The apparatus of claim 20, wherein the thermal insulating layer has thickness ranging from about 10 to 250 nm.

24. The apparatus of claim 20, wherein the transition layer has a thickness ranging from about 10 to 250 nm.

25. The apparatus of claim 14, wherein the reflectivity switch is adapted to provide at a select wavelength a minimum amount of reflectivity below the critical temperature and a maximum amount of reflectivity above the critical temperature.

26. The apparatus of claim 16, wherein the reflectivity switch critical temperature is below the meting temperature of the one or more process regions.

27. The apparatus of claim 14, wherein in the reflectivity switch is solid in the low reflectivity state.

28. The apparatus of claim 27, wherein the reflectivity switch is liquid in the high reflectivity state.

29. The apparatus of claim 14, further including a strippable layer between the workpiece and the absorber layer.

30. The apparatus of claim 29, wherein:
   the strippable layer comprises silicon dioxide;
   the absorber layer comprises titanium; and
   the reflective switch layer comprises a thermal insulating layer of silicon dioxide and a transition layer of amorphous silicon.

31. The apparatus of claim 30, wherein the strippable layer of silicon dioxide is about 10 nm thick.

32. The apparatus of claim 31, wherein the absorber layer of titanium is about 40 nm thick.

33. The apparatus of claim 32, wherein the thermal insulating layer is about 80 nm thick.

34. The apparatus of claim 33, wherein the transition layer of amorphous silicon is about 163 nm thick.

35. The apparatus of claim 34, wherein the absorber layer also includes a layer of titanium nitride.

36. The apparatus of claim 35, wherein the titanium is in the form of a layer about 20 nm thick and the titanium nitride layer is 20 nm thick.

37. The apparatus of claim 14, wherein the reflective switch critical temperature is less than a melting temperature of the workpiece but greater than an activation temperature of the one or more process regions.

38. The apparatus of claim 20, wherein the thermal insulating layer comprises two or more layers, wherein one of the layers is silicon oxynitride.

39. A system for controlling the amount of heat transferred to one or more process regions of a workpiece, comprising:
   a laser source;
   a workpiece support member arranged adjacent the light source for supporting the workpiece; and
   a reflectivity switch apparatus comprising:
      i) an absorber layer deposited atop the workpiece, a portion of which covers the process region or regions, wherein the absorber layer absorbs laser radiation and converts the absorbed radiation into heat; and
      ii) a reflective switch layer deposited atop the absorber layer, wherein a portion of said reflective switch layer covering said process region has a temperature that corresponds to the temperature of the process region and changes reflectivity from a low reflectivity state to a high reflectivity state at a critical temperature so as to limit the amount of radiation absorbed by the absorber layer and thus the amount of heat transferred to the process region.

40. The system of claim 39, wherein said laser source emits radiation at a wavelength between 500 nm and 1100 nm.

* * * * *